United States Patent [19]

Snail

[11] Patent Number: 5,704,976
[45] Date of Patent: Jan. 6, 1998

[54] HIGH TEMPERATURE, HIGH RATE, EPITAXIAL SYNTHESIS OF DIAMOND IN A LAMINAR PLASMA

[75] Inventor: Keith A. Snail, Silver Spring, Md.

[73] Assignee: The United States of America as represented by the Secretary of the Navy, Washington, D.C.

[21] Appl. No.: 697,060

[22] Filed: May 8, 1991

Related U.S. Application Data

[63] Continuation-in-part of Ser. No. 548,719, Jul. 6, 1990, abandoned.

[51] Int. Cl.$^6$ .................................................. C30B 29/02
[52] U.S. Cl. ...................... 117/98; 117/103; 117/924; 423/446; 427/577
[58] Field of Search ................ 423/446; 156/610, 156/DIG. 68; 427/39, 577; 521/86; 117/929, 98, 103

[56] References Cited

U.S. PATENT DOCUMENTS

| | | | |
|---|---|---|---|
| 3,714,334 | 1/1973 | Vickery | 423/446 |
| 3,749,760 | 7/1973 | Deryagin et al. | 423/146 |
| 4,816,286 | 3/1989 | Hirose | 427/39 |
| 4,938,940 | 7/1990 | Hirose et al. | 423/446 |
| 4,981,671 | 1/1991 | Moriyoshi et al. | 423/446 |
| 5,070,274 | 12/1991 | Yoshikawa et al. | 423/446 |

FOREIGN PATENT DOCUMENTS

| | | | |
|---|---|---|---|
| 386727 | 9/1990 | European Pat. Off. | 56/DIG. 68 |
| 58-135117 | 1/1982 | Japan . | |
| 60086096 | 10/1983 | Japan . | |
| 61-158899 | 12/1984 | Japan . | |
| 62113796 | 11/1985 | Japan . | |
| 62-223095 | 3/1986 | Japan . | |
| 2-55294 | 2/1990 | Japan | 156/DIG. 68 |

OTHER PUBLICATIONS

Gildenlolat et al., "High Temperature Schottky Diodes with Boron–Doped Homo–Epitaxial Diamond Base", Mat. Res. Bull, vol. 25, 1990 pp. 129–134.
Pate, "The Diamond Surface Atomic and Electronic Structure", Surface Science, vol. 165, 1986 pp. 83–142.
Spitsyn et al., "Vapor Growth of Diamond and Other Surfaces", Journal of Crystal Growth, vol. 52, 1981, pp. 219–226.

(List continued on next page.)

*Primary Examiner*—Robert Kunemund
*Attorney, Agent, or Firm*—Thomas E. McDonnell; Barry A. Edelberg

[57] ABSTRACT

A method for synthesizing large, single crystal diamond comprising mixing carbon source and a hydrogen source to form a mixture. The mixture is excited and reacted to form a reactive species in a laminar plasma plume. A substrate having a diamond seed crystal is disposed in the laminar plasma plume while maintaining the diamond seed crystal at a growth temperature between 1100° and 1700° C. for the deposition of diamond, thereby inducing deposition of single crystal diamond on the diamond seed crystal.

An apparatus for synthesizing diamond (10;15) comprising a plasma torch (30;31) for producing a laminar plasma plume (44;54). A carbon source ($CH_4$) and a hydrogen source ($H_2$,$CH_4$) are excited and reacted in the laminar plasma plume (44;54) so as to form a reactive species in the laminar plasma plume (44;54). A positioning device is used to dispose a substrate (11) having a diamond seed crystal in the laminar plasma plume (44;54), while a temperature maintaining device (12) is used to maintain the diamond seed crystal at a temperature between 1100° and 1700° C., thereby inducing deposition of single crystal diamond on the diamond seed crystal mounted on substrate (11).

17 Claims, 2 Drawing Sheets

OTHER PUBLICATIONS

Matsumoto et al., "Synthesis of Diamond Films in a RF Induction Thermal Plasma", Appl. Phys. Lett., vol.51(10), 1987 pp. 737–739.

Bachmann et al., "Emerging Technology of Diamond Thin Films", C&EN Special Report, 1989, pp. 24–39.

Ohtake et al., "Diamond Film Preparation by Arc Discharge Plasma Jet Chemical Vapor Deposition in the Methane Atmosphere", Journal oe the Electrochemical Society, vol.137, No.2, 1990, pp. 717–722.

Cappelli et al., "High Growth Rate Diamond Synthesis in a Large Area Atmospheric Preasure Inductively Coupled Plasma", J. Mater. Res., vol. 5, No. 11, 1990, pp. 2326–2333.

Anthony et al., "Thermal Diffusivity of Isotopically Enriched $^{12}$C Diamond", Amer. Phys. Soc., Phys. Rev.B, vol.42, No.2, 1990,pp. 1104–1111.

Narayan et al., "Laser Method for Synthesis and Processing of Continuous Diamond Films on Nondiamond Substrates", Science, vol.252 1991, pp. 416–418.

Hirose et al, "The Synthesis of High Quality Diamond in Combustion Flame", pp. 80–93.

Badzian et al., "Crystallization of Diamond Crystals and Films by Microwave Assisted CVD (Part II)", Mat. Res. Bull., vol. 23, 1988, pp. 531–548.

Zhu et al., "Graphite Formation in Diamond Film Deposition", J. Vac. Sci., vol.A7, No.3, 1989, pp. 2315–2324.

Cappelli et al., "An Investigation of Diamond Film Deposition in a Premixed Oxyacetylene Flame", J. Appl. Phys., vol.67, No.5 1990, pp. 2596–2602.

Kosby et al., "An Experimental and Theoretical Investigation of Flame–Formed Diamonds", Elsevier Science Publishers B.V., Materials Letter, vol.8, No.9, 1989,pp. 369–374.

Hirose et al., "Diamond Synthesis in Air by Using Flame", New Diamond, vol. 4, No. 3, pp. 34–35.

Matsumoto, "Development of CVD Diamond Synthesis Techniques", Esc Con., 1989, pp. 50–51, 56–57.

Kurthara et al., "High Rate Synthesis of Diamond by DC Jet Chemical Vapor Deposition", Appl. Phys. Lett., vol.52, No.6, 1988 pp. 437–438.

HIGH TEMPERATURE, HIGH RATE, EPITAXIAL SYNTHESIS OF DIAMOND IN A LAMINAR PLASMA

This application is a continuation-in-part of application Ser. No. 07/548,719 filed Jul. 6, 1990, which is incorporated by reference herein and abandoned.

BACKGROUND OF THE INVENTION

1. Field of the Invention

The present invention relates generally to synthesis of diamond and, more particularly, to homoepitaxial, high rate synthesis of large, single crystals and/or boules of diamond in a laminar plasma plume.

2. Description of the Related Art

Diamond synthesis by low-pressure chemical vapor deposition (CVD) using hydrocarbon gases mixed with hydrogen gas has been the subject of expanding interest and investigation over the last two decades. Recently, the growth rate of polycrystalline diamond films has been increased by the use of direct current (DC) and radio frequency (RF) plasma torches in the CVD process. See, for example, K. Kurihara, K. Sasaki, M. Kawasada and N. Koshino, "High rate synthesis of diamond by dc plasma jet chemical vapor deposition", Appl. Phys. Lett., Vol. 52, No. 6, pp. 437–438, 1988; and S. Matsumoto, M. Hino, T. Kobayashi, "Synthesis of diamond films in a rf induction thermal plasma", Appl. Phys. Lett., Vol. 51, No. 10, pp. 737–739, 1987.

There is a commonly held belief that high quality diamond cannot be grown on substrates held at temperatures above 1000°–1100° C. with low-pressure CVD techniques. See, for example, P. K. Bachmann and R. Messier, "Emerging Technology of Diamond Thin Films", Chem & Eng. News, pp. 24–39, 1989. This belief is partially based on studies that show graphite inclusions at temperatures above 1000° C. See, for example, B. V. Spitsyn, L. L. Bouilov and B. V. Derjaguin, "Vapor Growth of Diamond on Diamond and Other Surfaces", J. Crystal Growth, Vol. 52, pp. 219–226, 1981. It has been suggested that as the temperature is raised above 1000° C., such graphite inclusions result because the residence time of hydrogen on the diamond surface is not long enough to stabilize the surface hybridization. See, for example, B. B. Pate, "The Diamond Surface: Atomic and Electronic Structure", Surface Science, Vol. 165, pp. 83–142, 1986.

Single crystal diamond can be made by using a high pressure (>50 kbar) high temperature (>1500° C.) (HPHT) process with a solvent-catalyst such as nickel. See, for example, Nature, Vol. 176, 51, 1955. Large single crystal diamonds, i.e., approximately 5 to 10 mm, can be grown by the HPHT process at rates of over 100 microns per hour. Although single crystal diamonds can also be made by using low-temperature low-pressure CVD processes, the rate of single crystal diamond synthesis is about 2 to 3 orders of magnitude slower than that of HPHT processes. In addition, low-pressure CVD does not always produce a smooth, single crystal diamond surface.

There exists a need for a method of producing large, high quality, single crystal diamond at low pressure by CVD and at rates comparable to those obtained by HPHT processes.

SUMMARY OF THE INVENTION

Therefore, it is an object of the present invention to synthesize large, high quality, single crystal diamond at low pressure by CVD and at rates comparable to those obtained by HPHT processes.

This and other objects of the present invention are accomplished by a method for synthesizing diamond which comprises mixing a carbon source and a hydrogen source to form a mixture. This mixture is excited and reacted to form a reactive species in a laminar plasma plume. A diamond seed crystal is disposed in the laminar plasma plume while maintaining the diamond seed crystal at a growth temperature between 1100° and 1700° C. for the deposition of diamond, thereby inducing deposition of single crystal diamond on the diamond seed crystal.

An apparatus for synthesizing diamond comprising a plasma torch for producing a laminar plasma plume. A carbon source and a hydrogen source are excited and reacted in the laminar plasma plume so as to form a reactive species in the laminar plasma plume. A positioning device is used to dispose a substrate having a diamond seed crystal in the laminar plasma plume, while a temperature maintaining device is used to maintain the diamond seed crystal at a temperature between 1100° and 1700° C., thereby inducing deposition of single crystal diamond on the diamond seed crystal mounted on substrate.

Other features and advantages of the present invention will be set forth in, or apparent from, the detailed description of preferred embodiments of the present invention which follows.

DETAILED DESCRIPTION OF THE PREFERRED EMBODIMENTS

An apparatus for synthesizing diamond using a plasma torch technique according to the present invention includes a plasma torch, a mass flow control system, a gas supply, a substrate having a diamond seed crystal, a device for controlling the temperature of the substrate, and a thermocouple, resistance temperature device (RTD), pyrometer or the like for measuring the temperature of the substrate.

A method of synthesizing diamond according to the present invention includes the steps of: (a) mixing a carbon source and a hydrogen source to form a mixture; (b) exciting and reacting this mixture to form a reactive species in a laminar plasma plume; (c) placing a diamond seed crystal in the laminar plasma plume; and (d) maintaining the diamond seed crystal at a growth temperature between 1100° and 1700° C.

Figure 1:
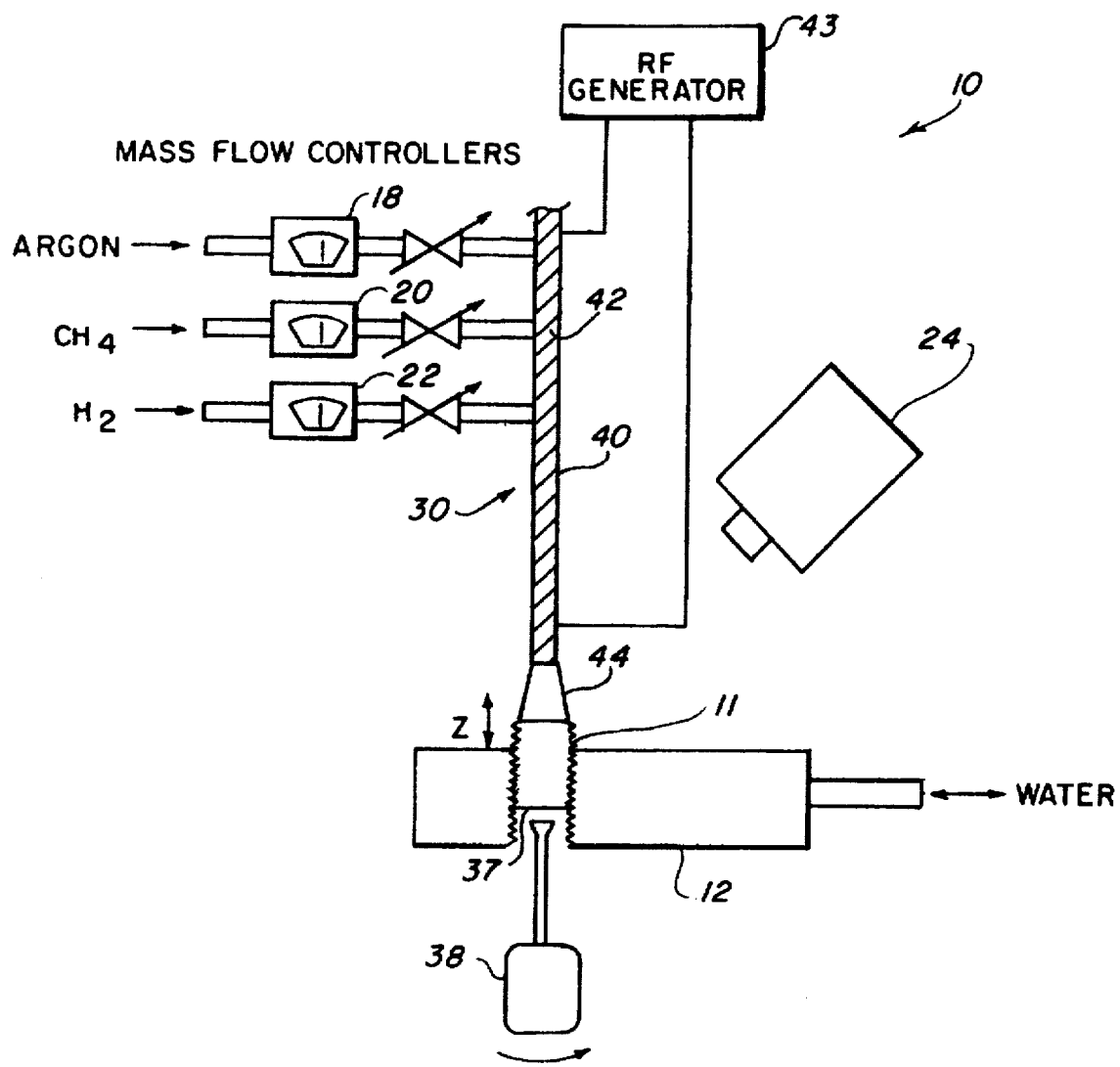
FIG. 1 is a schematic diagram of a radio frequency plasma torch deposition apparatus for practicing the process according to the present invention.

FIG. 1 is a schematic diagram of a radio frequency (RF) plasma torch deposition apparatus 10 for practicing the process according to the present invention. In apparatus 10, a substrate 11, with a high melting temperature and having a diamond seed crystal fixed thereon, is mounted in a water-cooled copper block mount 12. Conventional mass flow controllers 18, 20 and 22 are used to measure gas flow rates and ratios. Suitable mass flow controllers can be obtained from MKS Instruments Inc., Andover, Mass., for example. In the apparatus shown in FIG. 1, methane, hydrogen and argon are used as source gases.

Carbon sources which may be used in deposition of diamond according to the present invention include but are not limited to the following compounds which also function as hydrogen sources.

Saturated hydrocarbons: Methane, ethane, propane, butane, etc.

Unsaturated hydrocarbons: Ethylene, propylene, butylene, acetylene, etc.

Aromatic hydrocarbons: Benzene, toluene, xylene, cyclohexane, etc.

CHO compounds: Alcohols such as methanol, ethanol, propanol, butanol, ether group containing compounds.

Ketone group-containing compounds: Acetone, methyl ethyl ketone, diethyl ketone, 2,4-pentanedione, and 1'-butyronaphthone.

Esters: Methyl acetate, ethyl acetate, and isoamyl acetate.

Ketone group-containing compounds: Dimethyl ketene and phenyl ketene.

Acetyl group-containing compounds: Acetic acid, acetic anhydride, acetophenone, and biacetyl.

Aldehyde group-containing compounds: Formaldehyde, acetaldehyde and propionaldehyde.

Methylene group-containing compounds: Ketene and diazo methane.

Methyl group-containing compounds: t-Butyl peroxide, methyl hydroperoxide, and peracetic acid.

The compounds listed above can be used either singly or in combinations of two or more. Further, although the carbon and hydrogen sources listed above are the same gas, it is possible to use separate carbon and hydrogen sources in the mixture of gases, as well as diluents such as Argon, Xenon, etc. The hydrogen source and the diluent source can be recycled in order to reduce material cost.

While oxygen or oxygen containing compounds, e.g. methanol, are not normally used to a great extent in plasma torch depositions, the inclusion of oxygen or oxygen containing compounds via the feedstock gases or via entrainment of room air provides diamond of improved quality. Thus, it may be desirable to add oxygen or oxygen containing compounds to the carbon, hydrogen and diluent sources.

When a plasma torch is used to excite the mixture of gases according to the present invention, it is possible to use hydrocarbon sources which burn at relatively low temperature, e.g. methane, and are thus unsuitable for combustion CVD processes. It is noted that the cost of hydrocarbon sources isotopically enriched with $^{12}C$ which burn at a relatively low temperature is relatively low compared to that of hydrocarbon sources isotopically enriched with $^{12}C$ which burn at a relatively high temperature.

Plasma torches decouple the gas temperature of the hydrocarbon from its burning temperature because current or radio frequency energy, for example, is used to excite the mixture of gases. Thus, plasma torches provide another degree of freedom over combustion CVD processes. The gas temperature of the hydrocarbon determines the hydrogen disassociation fraction, which should be as high as possible to keep the growing diamond surface hydrogen terminated. The burning temperature of oxygen-acetylene combustion CVD is approximately 3000° C. having a disassociation fraction of about 1–5%. On the other hand, the gas temperature of hydrocarbons used in plasma torches according to the present invention can easily exceed 7000° C., while having a hydrogen disassociation fraction of more than 95%.

For deposition of large single diamond crystals with ultra-high thermal conductivity, preferred carbon sources include isotopically enriched ($^{12}C$ fraction≧99.9%) hydrocarbon source gases such as isotopically enriched methane or acetylene, which can be obtained from source such as Cambridge Isotope Lab, Woburn, Massachusetts or Isotec Labs, Westerville, Ohio. It has been shown that the thermal conductivity of diamond can be significantly increased by reducing the approximately 1% $^{13}C$ contamination found in natural diamonds. See, for example, T. Anthony, W. Banholzer and J. Fleischer, "Thermal diffusivity of isotopically enriched $^{12}C$ diamond", The American Physical Society, Vol. 42, No. 2, pp. 1104–1111, 1990. It is noted that the Anthony et al. article involves both CVD and HPHT steps and consequently is considerably more complicated and capital intensive than the present invention.

Reductions in cost may be realized by using solid carbon sources, in analogy to the Verneuil process for sapphire, where a finely powdered source of solid material is slowly introduced into a flame. In the Verneuil process, the solid material is melted and reforms on a growing boule. In the present invention, on the other hand, a finely powdered solid carbon is gasified in the plasma and then contributes to the gaseous flux of species striking the growing diamond crystal or boule. The finely powdered solid carbon may be gasified in the plasma by injecting the finely powdered solid carbon into the gas flow. Alternatively, the finely powdered solid carbon may be gasified in the plasma by placing the finely powdered solid carbon on a meshed screen and vibrating the meshed screen so that the finely powdered solid carbon falls via gravity into the plasma.

A conventional RF plasma torch 30, such as can be obtained from TAFA Inc., Concord, N.H. or Technion Inc., Irvine, Calif., is preferably mounted on conventional xyz translation stage, such as can be obtained from Newport Corp., Newport, Calif., for accurate and repeatable positioning relative to water-cooled copper block mount 12. A temperature measuring device 24, e.g., a two-color near-infrared pyrometer, such as can be obtained from Williamson Corp., Concord, Mass., is used to monitor substrate temperatures, which vary from about 1100° C. to 1700° C. The temperature measuring device 24 can be calibrated with a chromel/alumel thermocouple attached to a Si substrate heated in a tube furnace. The temperature measuring device 24 should be insensitive to the emission wavelengths of the RF plasma torch 30, i.e., $\lambda$>2.0 µm. The temperature of the substrate 11 is adjusted by rotating substrate 11 with a screwdriver 38 inserted in a screwdriver slot on a bottom end surface 37 of substrate 11, which is in the form of a threaded cylinder, so as to vary the degree of insertion of the substrate 11 in the water-cooled copper block mount 12. Alternatively, the temperature of the substrate 11 may be adjusted by repositioning the substrate 11 along the Z axis in the plasma plume produced by RF plasma torch 30.

The conventional RF plasma torch 30 includes a tube 40, preferably made of quartz. A copper RF coil 42 is wound around the tube 40, and along with a radio frequency generator 43, generates RF waves which excite the gases in the tube 40 to form a laminar plasma plume 44 which deposits diamond on substrate 11. While the laminar plasma plume 44 is shown as existing outside the tube 40, in fact, the laminar plasma plume 44 extends inside of tube 40. The temperature measuring device 24 is used to monitor the temperature of the laminar plasma plume 44, and of the substrate 11.

Detailed descriptions of RF plasma torch processes which may be used with the method of the invention are described in S. Matsumoto et al., cited above; and M. A. Capelli, T. G. Owano and C. H. Kruger, "High growth rate diamond synthesis in a large area atmospheric pressure inductively coupled plasma", J. Mater. Res., Vol. 5, No. 11, pp. 2326–2333, 1990, the entire contents and disclosures of which are hereby incorporated herein by reference.

Figure 2:
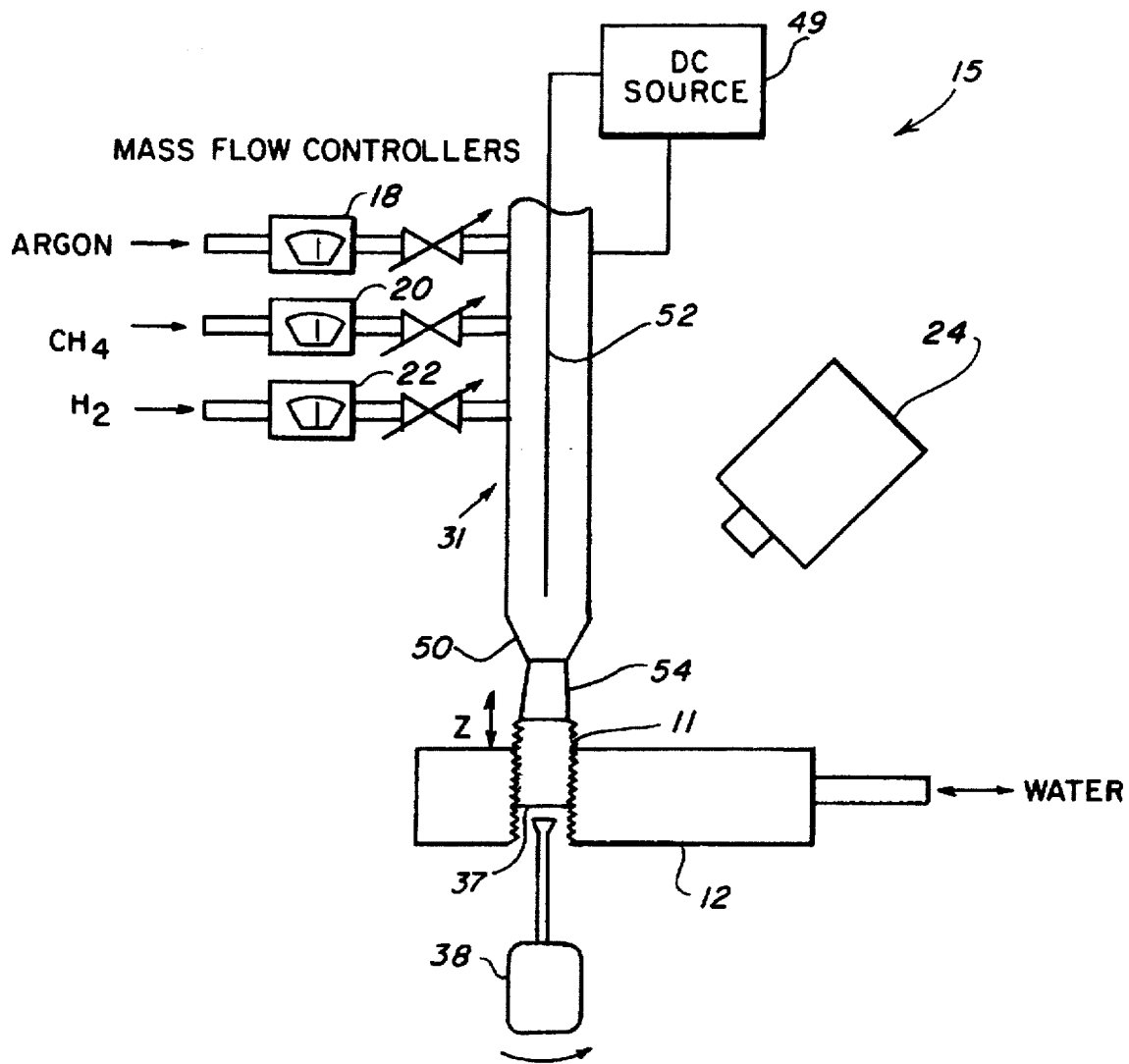
FIG. 2 is a schematic diagram of a direct current plasma torch apparatus for practicing the process according to the present invention.

FIG. 2 is a schematic diagram of a direct current (DC) plasma torch deposition apparatus 15 for practicing the process according to the present invention. The apparatus 15 is similar to RF plasma torch deposition apparatus 10, but includes a conventional DC plasma torch 31 having a nozzle electrode 50 and an inside electrode 52 in place of tube 40 and RF coil 42. The conventional DC plasma torch may be obtained from, for example, Technion Inc., Irvine, Calif. or TAFA Inc., Concord, N.H. The inside electrode 52 is connected to a direct current power source 49 and is oppositely charged relative to the nozzle electrode 50 so that there is a discharge between the inside electrode 52 and the nozzle electrode 50. This discharge causes the excitation of the gases in the nozzle electrode 50 and the formation of a laminar plasma plume 54 which deposits diamond on the substrate 11.

Detailed descriptions of DC plasma jet processes which may be used with the method of the present invention are described in K. Kurihara et al., cited above; and N. Ohtake and M. Yoshikawa, "Diamond Film Preparation by Arc Discharge Plasma Jet Chemical Vapor Deposition in the Methane Atmosphere", Journal of the Electrochemical Society, Vol. 137, No. 2, pp. 717–722, 1990, the entire contents and disclosures of which are hereby incorporated herein by reference.

In the process of the present invention the plasma plume 44 is operated in a laminar mode. The laminar and turbulent regimes are separated by a transition zone defined within the Reynolds number (Re) range between about 1200 and 2000. Laminar flow occurs for Reynolds numbers of less than about 1200. See, for example, R. B. Bird, W. E. Stewart, E. N. Lightfoot, "Transport Phenomena", pp. 153–156, John Wiley, 1960). The Reynolds number is defined as:

$$Re = \langle v \rangle \rho d / \mu$$

where $\langle v \rangle$ is the average velocity, $\rho$ is the average density of gases in the plasma plume, d is the tube diameter of the plasma torch, and $\mu$ is the average viscosity of gases in the plasma plume. For Re <1200, the flow within the tube is always laminar. In the transition region, 1200<Re<2200, small random flow fluctuations tend to be damped out, but larger fluctuations tend to destabilize the flow. Abrupt switches from laminar to turbulent behavior are thus possible in this transition region.

It has been found that combustion flames sometimes operate in a laminar mode, even if the flow within a burner tube from which the combustion flame emanates is turbulent or within the transition zone. See, for example, K. A. Snail and Craigie, "Synthesis of High Quality Diamond Films in a Turbulent Flame", Appl. Phys. Lett., Vol. 58, pp. 1875–1877, 1991. Micro Schlieren photography may be used to determine whether a flame is laminar or turbulent. See, for example, Combustion, second edition, I. Glassman, Academic Press, New York, 1981. Micro Schlieren photography uses short exposure (less than a microsecond) to determine whether a flame is laminar or turbulent. When a plasma jet is operated is a laminar mode, a micro Schlieren photograph shows a crisp plasma jet. However, when the plasma plume is operated in a turbulent mode, a micro Schlieren photograph shows a fuzzy and agitated plasma jet. A micro Schlieren photograph could be used to ensure that the plasma plume is in a laminar mode.

At least one diamond seed crystal mounted on substrate 11 is required in order to grow small (<1 carot) or large (1 to 10 carots) diamond crystals or boules of diamond by the method of the present invention, and it is preferable to use multiple diamond seed crystals in a single deposition because this improves the per unit cost. For example, the per unit cost of electricity used to provide plasma torch deposition decreases when multiple diamond seed crystals are used. It is preferable for each of the multiple diamond crystal seeds to be located within the laminar plasma plume. Therefore, the number of diamond seed crystals that can be used in a single deposition is a function of the boundary of the laminar plasma plume. In addition, the diamond seed crystals should be spaced so that they do not merge during the deposition. Also, in analogy to the detrimental effect of the shadow of one tree in an orchard upon the growth of an adjacent tree in the orchard, the diamond seed crystals should be spaced apart so that they do not diminish each other's growth.

The diamond seed crystal may be a natural or HPHT diamond. Alternatively, the diamond seed crystal may be a treated metal or semiconductor having a thin, single crystal diamond surface formed by implantation. See, for example, J. Narayan, V. Godbole and C. White, Laser Method for Synthesis and Processing of Continuous Diamond Films on Nondiamond Substrates, Vol. 252, pp. 416–418, 1991. In another alternative, the diamond seed crystal may be in the form of a silicone wafer having a plurality microscopic pits etched therein, in which a plurality of microscopic single crystal diamonds are inserted and aligned relative to each other, and wherein a thin, single crystal diamond layer is epitaxially grown joining the microscopic single crystal diamonds. See, for example, M. W. Geis and H. I. Smith, "Production of Large-Area Mosaic Diamond Films Approaching Single Crystal Quality", No. 95, Annual Meeting of Electrochemical Society, Washington, D.C., May 6, 1991.

Also, it is preferable to use a diamond seed crystal having a <100>, <110> or <111> orientation, and having a polished {100}, {110} or {111} face upon which the diamond is to be grown. Alternatively, the low index crystallographic plane of the diamond seed crystal may be "misoriented" relative to the surface of the diamond seed crystal. Typically, such "misorientation" is less than or equal to a few degrees.

The face of the diamond seed crystal may be abrasively polished, for example, with a high-speed cast iron scaife. Preferably, the face of the diamond seed crystal is chemically polished so as to prevent surface defects produced by abrasive polishing. See, for example, M. Yoshikawa, "Development and Performance of a Diamond Film Polishing Apparatus with High Metals", Proceedings of the Conference on Diamond Optics III, SPIE, Vol. 1325, International Society for Optical Engineers, Bellingham, Wash., 1991.

There should be good thermal contact between substrate 11 and the diamond seed crystal. Preferably, the diamond seed crystal is conventionally brazed (such as available by Sumotomo Electric, Westerville, Ohio) to substrate 11 with a thermally conductive material. Most preferably, this is done by brazing the diamond seed crystal to substrate 11 with a gold-tantalum alloy.

Substrate 11 and the diamond seed crystal surface upon which the diamond is to be grown should also be chemically cleaned prior to the deposition of the diamond crystals so that no foreign particles remain. Preferably, this is done ultrasonically using an ultrasonic cleaning device, such as available from VWR Scientific, Baltimore, Maryland, and a standard organic solvent such as methanol or acetone. Most preferably, methanol is the solvent. The surface must remain clean until the deposition, so it is preferable to keep the substrate 11 in a particle-free environment.

Any means of controlling the substrate temperature may be used. Preferably, a mount whereby the thermal conductance between the substrate surface and the mount can be varied is used. Most preferably, a water-cooled copper block mount 12 having a threaded hole is used. Substrate 11 can be in the form of a threaded rod made of molybdenum (Mo), for example, with the diamond seed crystal brazed to a top end surface of substrate 11 and having a screwdriver slot at bottom end surface 37. The substrate 11 is fitted into the threaded hole and raised or lowered from the surface of the water cooled copper block mount 12 by a screwdriver 78, respectively decreasing or increasing the thermal conductance, and thereby increasing or decreasing the temperature of the substrate 11 and the diamond seed crystal brazed on the substrate 11. For higher temperatures, e.g., greater than 1200° C., the mount may be uncooled, the threaded rod substrate 11 may be lengthened and/or a "waist" cut be made into the threaded rod substrate 11 in order to further increase thermal resistance.

The temperature of substrate 11 may be controlled in a variety of other ways including clamping the substrate to a heat sink and flowing cool gas over the bottom of the substrate or the apparatus on which it is mounted. The temperature of substrate 11 may also be controlled by installing thermally resistive washers between substrate 11 and water-cooled cooper block mount 12, wherein the thermal conductance between the substrate surface and the mount can be varied by changing the thickness of the thermally resistive washers. Furthermore, substrate 11 and water-cooled copper block mount 12 may have a non-threaded interface, so that substrate 11 is slidable within water-cooled copper block mount 12.

The temperature at which the deposition occurs should be high enough so that large crystal growth occurs, but not so high that the surface dehydrogenates and the bulk of the diamond crystal is degraded. Preferably, the growth temperature of the diamond growing surface is regulated to between about 1100° C. to about 1700° C. Most preferably, the range is from about 1200° C. to about 1500° C.

The upper temperature limit for homoepitaxial, i.e., diamond-on-diamond, growth is determined by the desorption of hydrogen and the stability of the diamond crystal, and may exceed 1700° C. if sufficient hydrogen flux is available by providing a high hydrogen flow rate, for example.

Since high temperature is important to proper deposition, a temperature measuring device 24 should be used. Preferably, one or more two-color pyrometers are used. Most preferably, one two-color pyrometer is used. The temperature of the diamond seed itself need not be measured. As long as the diamond seed crystal is in good thermal contact with substrate 11, the diamond temperature generally will not deviate significantly from the substrate temperature.

The method of the invention may be practiced under various pressures, but preferably the plasma deposition of diamond is performed in a low pressure chamber (not shown), such as available from TAFA Inc., Concord, N.H. or Technion Inc., Irvine, Calif. Plasma deposition is preferably performed in a chamber near, at or below atmospheric pressure, because lower pressures expand the size of the laminar plasma plume suitable for growing diamond and because low pressure chambers permit one to exclude nitrogen from the growth environment due to the low pressure of the chamber.

The duration of deposition will depend on how much strain is present in the diamond crystals. Some applications may require very little strain deviation from that found in natural diamonds, but some applications may allow for more strain. In fact, one may desire to produce diamonds with very low strain, so that steady state boule growth, i.e., a continuous process, is possible. Generally, the longer the diamond film is allowed to deposit on the substrate, the more strain will be present in the diamond. Strain is dependent on process parameters such as diamond seed crystal temperature, the position of the diamond seed crystal in the laminar plasma plume and the hydrocarbon to hydrogen ratio. Surprisingly, the method of the invention not only gives large single crystal diamond or boules of diamond but also results in nominal growth rates of greater than 200 microns per hour.

EXAMPLE 1

The apparatus used for diamond growth includes a DC plasma torch, a gas mass flow control system, and a water-cooled copper block mount. A two-color pyrometer is used to monitor substrate temperature during diamond growth. The arrangement of these components is shown in FIG. 2.

Diamond is grown on a diamond seed crystal brazed to the substrate with layer of AuTa. The substrate is in the form of a ¼–20 threaded cylindrical Mo rod having a length of 1.5 cm and a diameter of 1 cm. The diamond seed crystal consists of a natural type IIa diamond heat sink having a thickness of 0.25 mm, which is laser cut to form a cylinder and polished on the top {100} face. The top surface of the diamond seed crystal has a <100> orientation, with a slight misorientation and is ultrasonically cleaned with methanol. The experimental conditions are listed in Table 1.

TABLE 1

| Experimental Conditions | |
|---|---|
| Gas flow rate | |
| $H_2$ | 12.5 SLM |
| $CH_4$ | 0.37 SLM |
| Ar | 37.5 SLM |
| Current | 300 amps |
| Voltage | 40 volts |
| Distance from nozzle to substrate surface | 10 cm |
| Substrate temperature | 1300°C. |
| Deposition time | 1 hour |

The diameter of the DC plasma torch nozzle is chosen so as to provide a laminar plasma plume. This is confirmed by micro Schlieren photography of the plasma plume.

The substrate having the diamond seed crystal brazed thereto is inserted into the water-cooled copper block mount, which is positioned so that the substrate is outside of the area which will be occupied by the laminar plasma plume. The apparatus is enclosed in a low pressure chamber, which is evacuated prior to deposition. The DC plasma torch is then ignited with only argon flow. After the DC plasma torch has been ignited, methane and hydrogen flow begins. The water-cooled copper block mount is then repositioned so that the substrate is within the laminar plasma plume and about 10 cm from the DC plasma torch nozzle. The temperature of the substrate is monitored by the two-color pyrometer. During the one hour deposition, the substrate is maintained at 1300° C. by moving the water-cooled copper block mount in the Z direction so as to move the substrate 11 within the laminar plasma plume and by changing the insertion height of the substrate within the water-cooled copper block mount.

The cylindrical diamond seed crystal begins to take on an octagonal shape after 10 minutes, with faces corresponding to <100> and <111> orientations. The optical transparency of the deposited material is good. It is possible to optically focus on the AuTa braze through the deposited material. It is also possible to optically focus on imperfections on the surface of the original diamond seed crystal. The growth rate is over 200 microns per hour.

EXAMPLE 2

The experiment of EXAMPLE 1 is repeated with a diamond seed crystal polished on the top {110} face, having a <110> orientation, with a slight misorientation. Again, the cylindrical diamond seed crystal begins to take on an octagonal shape after 10 minutes, with faces corresponding to <110>, <100> and <111> orientations. The optical transparency of the deposited material is good and the growth rate is over 200 microns per hour.

The experiment of EXAMPLE 1 is repeated with a reduced methane flow rate, i.e., 0.20 SLM. The other flow rates are not changed. The deposited material exhibits improved crystal morphology, i.e., a lower level of defects, but grows at a slower rate of about 120 microns per hour.

Numerous modifications and adaptations of the present invention will be apparent to those so skilled in the art. For example, the present invention may be adapted for doping layered diamond structures. Also, other techniques of producing highly activated plasma can be used according to the present invention, such as microwave torches and combinations of RF plasma torches, DC plasma torches and microwave torches. Thus, it is intended by the following claims to cover all modifications and adaptations which fall within the true spirit and scope of the present invention.

What is claimed is:

1. A method for homoepitaxial synthesis of single crystal diamond on a diamond seed crystal, comprising the steps of:
   (a) mixing a carbon source and a hydrogen source to form a mixture;
   (b) exciting and reacting said mixture to form a reactive species in a laminar plasma plume;
   (c) placing the diamond seed crystal in said laminar plasma plume; and
   (d) maintaining the diamond seed crystal at a temperature above about 1100° C. and at no more than about one atmosphere of pressure.

2. A method as recited in claim 1, wherein:
   said laminar plasma plume has a laminar flow mode in a region where the diamond seed crystal is placed in step (c).

3. A method as recited in claim 1, wherein step (a) further comprises the substep of:
   adding a diluent to said mixture.

4. A method as recited in claim 3, wherein:
   said diluent is argon.

5. A method as recited in claim 1, wherein step (a) further includes the substep of:
   adding at least one of oxygen and an oxygen containing compound to said mixture.

6. A method as recited in claim 1, wherein step (b) includes the substep of:
   exciting said mixture with a DC plasma torch.

7. A method as recited in claim 1, wherein step (b) includes the substep of:
   exciting said mixture with a RF plasma torch.

8. A method as recited in claim 1, wherein step (d) further includes the substep of:
   maintaining the diamond seed crystal at a temperature under about 1700° C.

9. A method as recited in claim 1, wherein step (d) further includes the substep of:
   maintaining the diamond seed crystal at a temperature between about 1200°–1500° C.

10. A method as recited in claim 1, wherein:
    said carbon source is isotopically enriched with $^{12}C$.

11. A method as recited in claim 1, wherein:
    said carbon source includes finely powdered solid carbon.

12. A method for epitaxial synthesis of a single crystal diamond on a substrate including a plurality of diamond seed crystals, comprising the step of:
    (a) mixing a carbon source and a hydrogen source to form a mixture;
    (b) exciting and reacting said mixture to form a reactive species in a laminar plasma plume;
    (c) placing the substrate in said laminar plasma plume; and
    (d) maintaining the substrate at a temperature between about 1100°–1700° C. and no more than about one atmosphere pressure.

13. A method as recited in claim 12, wherein:
    the substrate includes a diamond seed crystal.

14. A method as recited in claim 12, wherein step (d) includes the substep of:
    maintaining the substrate at a temperature between about 1200°–1500° C.

15. A method as recited in claim 12, wherein step (b) includes the substep of:
    exciting said mixture with a DC plasma torch.

16. A method as recited in claim 12, wherein step (b) includes the substep of:
    exciting said mixture with a RF plasma torch.

17. A method for homoepitaxial synthesis of single crystal diamond on a diamond seed crystal, comprising:
    (a) mixing methane, hydrogen and argon to form a mixture;
    (b) exciting and reacting said mixture with a plasma torch to form a reactive species in a laminar plasma plume;
    (c) placing the diamond seed crystal in said laminar plasma plume; and
    (d) maintaining the diamond seed crystal at a temperature between about 1200°–1500° C. and no more than about one atmosphere pressure.

* * * * *